United States Patent [19]
Oh et al.

[11] Patent Number: 5,736,765
[45] Date of Patent: Apr. 7, 1998

[54] EEPROM CELL HAVING IMPROVED TOPOLOGY AND REDUCED LEAKAGE CURRENT

[75] Inventors: Han Su Oh; Jang Han Kim, both of Chungcheongbuk-do, Rep. of Korea

[73] Assignee: LG Semicon Co., Ltd., Chungcheongbuk-do, Rep. of Korea

[21] Appl. No.: 451,415

[22] Filed: May 26, 1995

[51] Int. Cl.$^6$ ................ H01L 29/76; H01L 29/788
[52] U.S. Cl. ................ 257/321; 257/314; 257/315
[58] Field of Search ................ 257/314, 315, 257/321

[56] References Cited

U.S. PATENT DOCUMENTS

| | | | |
|---|---|---|---|
| 4,990,979 | 2/1991 | Otto | 257/321 |
| 5,173,436 | 12/1992 | Gill et al. | 437/43 |
| 5,315,142 | 5/1994 | Acovic et al. | 257/321 |
| 5,359,218 | 10/1994 | Taneda | 257/321 |
| 5,486,714 | 1/1996 | Hong | 257/321 |
| 5,506,431 | 4/1996 | Thomas | 257/321 |
| 5,583,360 | 12/1996 | Roth et al. | 257/315 |

*Primary Examiner*—Valencia Martin Wallace
*Attorney, Agent, or Firm*—Finnegan, Henderson, Farabow, Garrett & Dunner, L.L.P.

[57] ABSTRACT

An EEPROM cell of reduced leakage current during erasure and improved cell topology includes a first conductivity type substrate having a channel region, a trench formed in the channel region of the substrate, first spacers formed on opposed sidewalls of the trench, and a gate oxide film formed at the bottom of the trench between the first spacers. Second conductivity type source/drain regions are formed in the substrate at opposite side of the trench. A tunneling oxide film is further provided on the substrate overlying the drain region and proximate the trench. An insulation film is provided over the entire substrate surface except the trench and the tunneling oxide film. In addition, a floating gate is formed on the insulation film over the source and drain regions, as well as the gate oxide film at the trench bottom. Second spacers are provided on the insulation film at opposed side surfaces of the floating gate. A dielectric film is then provided on the surface of the floating gate and the second spacers, and a control gate is formed on the dielectric film.

7 Claims, 6 Drawing Sheets

EEPROM CELL HAVING IMPROVED TOPOLOGY AND REDUCED LEAKAGE CURRENT

FIELD OF THE INVENTION

The present invention is directed towards a non-volatile semiconductor memory element and related method of fabrication. In particular, the present invention is directed toward an EEPROM cell having improved topology and reduced leakage current.

BACKGROUND OF THE INVENTION

FIGS. 1(a)–1(h) illustrate fabrication steps in a conventional process for making an electrically erasable, programmable read-only memory (EEPROM) cell. As shown in FIG. 1(a), an oxide film 13 and a nitride film 15 are respectively deposited on a p-type semiconductor substrate 11. A portion of the surface of substrate 11 corresponding to a source region of the EEPROM cell is then exposed by etching oxide film 13 and nitride film 15.

As shown in FIG. 1(b), an n+-type source region 17 is formed by ion implanting n-type impurities into substrate 11 using oxide film 13 and nitride film 15 as a mask. The substrate is then subjected to a conventional field oxidation process to form a first field oxide film 19. Nitride film 15 and oxide film 13 are then sequentially removed.

As shown in FIG. 1(c), oxide film 21 and nitride film 23 are then respectively deposited on semiconductor substrate 11. These layers are then etched to expose a portion of the substrate surface corresponding to a drain region of the EEPROM cell.

As shown in FIG. 1(d), n+-type drain region 25 is formed by ion implanting N-type impurities into the exposed substrate surface illustrated in FIG. 1(c), using oxide film 21 and nitride film 23 as an implantation mask. The substrate is again subjected to a conventional field oxidation process to form a second field oxide film 27. As further shown in FIG. 1(d), the N+-type drain region 25 and second field oxide film 27 are spaced a predetermined distance in the substrate surface from N+ source region 17 and first field oxide film 19, which were previously formed in the steps illustrated in FIGS. 1(a)–1(b). Remaining portions of oxide film 21 and nitride film 23 are then removed.

As shown in FIG. 1(e), a gate oxide film 29 is formed over an exposed portion of the substrate surface not covered by field oxide films 19 and 27. FIG. 1(f) illustrates the step of forming a tunnelling oxide film 31 over a portion of N+ drain region 25 by removing a corresponding portion of field oxide film 27 overlying drain region 25. Tunnelling oxide film 31 is formed by thinning the second field oxide film 27 over a central portion of drain region 25 by a predetermined amount so that only a thin portion of field oxide film 27 remains.

As shown in FIG. 1(g), a first floating gate electrode 33 of the EEPROM cell is formed by depositing a polysilicon film over the entire substrate surface including first and second oxide films 19 and 27, respectively, and the tunnelling oxide film. The polysilicon film is then patterned in a conventional manner to form floating gate electrode 33. Lastly, as shown in FIG. 1(h), a dielectric film 35 is formed on an exposed surface of floating gate 33, and a second polysilicon control gate electrode 37 of the EEPROM cell is provided on dielectric film 35. FIG. 1(h) illustrates the resulting conventional EEPROM cell.

Writing and erasing operations of the above-described conventional EEPROM cell will now be discussed with reference to FIG. 2. First, when writing or programming the EEPROM cell, a high voltage is applied to control gate 37 through a voltage application terminal $V_{CG}$, and a low voltage or ground is applied to drain region 25 via a voltage application terminal $V_D$. In this case, either a low source voltage is applied to terminal $V_S$ of the source region 17, or the source voltage is floating. As a result, electron-hole pairs are formed in the channel region between source and drain regions 17 and 25, respectively. Some of the electrons from these electron hole pairs are then injected into drain region 25 due to the large potential difference between the control gate 37 and drain region 25. These electrons then tunnel into floating gate 33 through the thin tunnelling oxide film 31. As increasing numbers of electrons accumulate in floating gate 33, the threshold voltage $V_T$ of the EEPROM cell correspondingly increases. When information is erased from the EEPROM cell, however, a low voltage or ground is applied to control gate 37 through the associated voltage application terminal $V_{CG}$. Further during the erasing operation, a high voltage is applied to drain region 25 through the voltage application terminal $V_D$, while source region voltage application terminal $V_S$ remains floating. As a result, a potential difference is created between the control gate 37 and drain region 25 which causes electrons previously accumulated on floating gate 33 to drain off to drain region 25 through tunnelling oxide film 31. As shown in FIG. 3, as increasing numbers of electrons are drained off floating gate 33 to drain region 25, the potential across tunnelling oxide 31 correspondingly decreases.

The above-described EEPROM cell, however, suffers from the following problem. Due to the high voltages involved during the erasing process, a depletion region 39 is formed between tunnelling oxide film 31 and a channel region, which includes a portion of drain region 25 beneath second oxide film 27. Specifically, a high voltage present on control gate 37 depletes a portion of the drain region where the second field oxide film 27 is thin. As a result, holes in the drain region beneath tunnelling oxide film 31 flow from drain 25 to substrate 11 as a leakage current.

Moreover, the fabrication process used to make the above described EEPROM cell is complicated. In particular, two field oxidation processes are required to form the thick field oxide films, and an etching process is also needed to etch the field oxide film to a specified thickness in order form the thin tunnelling oxide film.

SUMMARY OF THE INVENTION

The present invention is directed toward solving the foregoing problems, and, more specifically has an object of providing an EEPROM and a related method in which the EEPROM cell has a reduced leakage current between the substrate and the drain region during erasing of the EEPROM cell.

Another object of the present invention is to provide an EEPROM cell and related method in which the EEPROM cell has an improved topology in which the source and drain regions are buried, but are not covered by a thick field oxide film.

A further object of the present invention is to provide an EEPROM cell and related method in which the buried source and drain regions, as well as the tunnelling oxide film, are formed by a simplified fabrication process.

These and other objects and features of the present invention can be achieved by providing a semiconductor device comprising: a substrate having a first conductivity type, the substrate having a primary surface; a channel region formed in the substrate; a trench formed in the primary surface of the substrate overlying the channel region, the trench having first and second sidewalls; a first spacer formed on the first sidewall and a second spacer formed on the second sidewall of the trench; a gate oxide film formed on a bottom portion of the trench between the first and second spacers; a source region having a second conductivity type formed in the substrate adjacent the first sidewall of the trench and adjacent the bottom of the trench; a drain region having the second conductivity type formed in the substrate adjacent the second sidewall of the trench and adjacent the bottom of the trench, a portion of the drain region extending in a direction away from the trench; a tunneling oxide film formed on the primary surface of the substrate overlying the portion of the drain region extending away from the trench, an edge portion of the tunneling oxide film is adjacent the trench; an insulation film provided on the entire substrate surface, the insulation film exposing the tunneling oxide film and the trench; a floating gate formed on the insulation film overlying the source region, the floating gate also overlying the gate oxide film and the tunneling oxide film, the floating gate having first and second side surfaces; a third spacer formed on the insulation film adjacent the first side surface; a fourth spacer formed on the insulation film adjacent the fourth side surface; a dielectric film formed on the floating gate and the third and fourth spacers; and a control gate formed on the dielectric film.

In accordance with a further aspect of the present invention, a method for fabricating an EEPROM cell is provided comprising the steps of: forming a first insulation film on a semiconductor substrate having a first conductivity type and a surface; forming a first photoresist film on the first insulation film; patterning the first photoresist film to expose first and second portions of the first insulation film by a photoetching process; forming a source region having a second conductivity type by implanting impurities of the second conductivity type into the substrate through the exposed first portion of the first insulation film using the first photoresist film as a mask, the source region having a predetermined junction depth; forming a drain region having the second conductivity type by implanting impurities of the second conductivity type into the substrate through the exposed second portion of the first insulation film using the first photoresist film as the mask, the drain region having the predetermined junction depth; forming a trench by etching the substrate between source and drain regions and etching portions of the source and drain region, the trench having first and second sidewalls; forming first and second spacers on the first and second sidewalls of the trench by coating a second insulation film over the surface of the substrate and anisotropically etching the second insulation film, the first spacer is adjacent the drain region and the second spacer is adjacent the source region; forming a gate oxide film on a bottom of the trench between the first and second spacers; forming a tunneling oxide film over the drain region adjacent the first spacer; forming a floating gate on the first insulation film overlying the source and drain region, the floating gate is formed on the tunneling oxide film and the trench, the step of forming the floating gate including the steps of coating a film on the surface of substrate and patterning the film, the floating gate having first and second side surfaces; forming third and fourth spacers on the first insulation film at the first and second side surfaces, respectively, of the floating gate by providing a third insulation film on the surface of the substrate and anisotropically etching the third insulation film; forming a capacitor dielectric film on the floating gate and the third and fourth spacers; and forming a control gate on the dielectric film.

DETAILED DESCRIPTION OF THE INVENTION

A preferred embodiment of the present invention will be explained in detail with reference to the attached drawings.

Figure 1A:
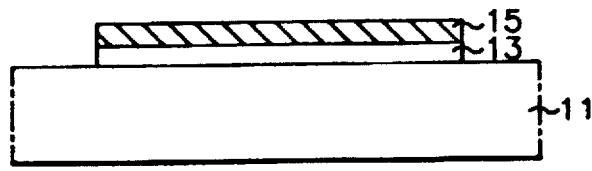
FIGS. 1(a)–1(h) show process steps for fabricating a conventional EEPROM cell.
Figure 1B:
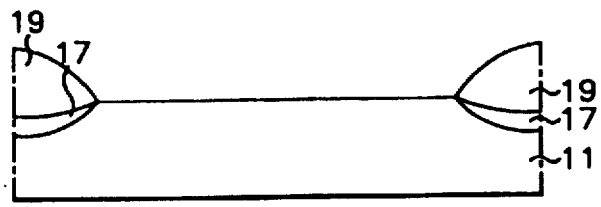
Figure 1C:
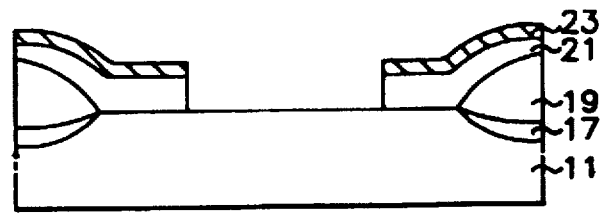
Figure 1D:
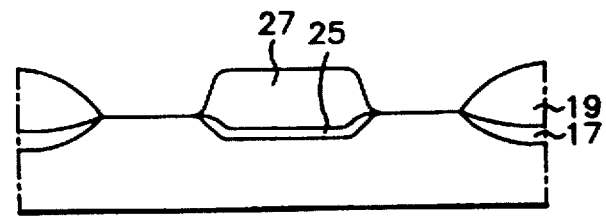
Figure 1E:
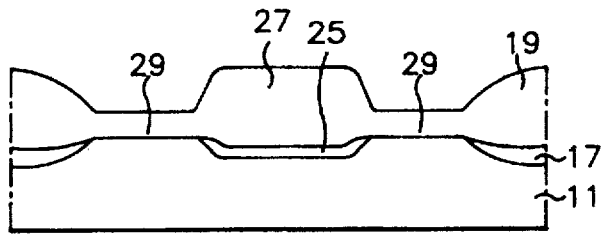
Figure 1F:
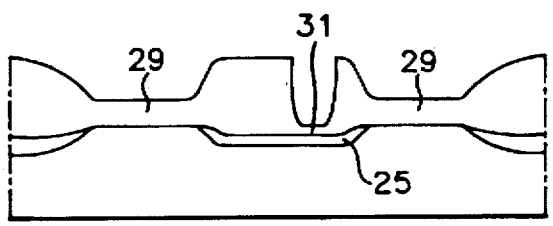
Figure 1G:
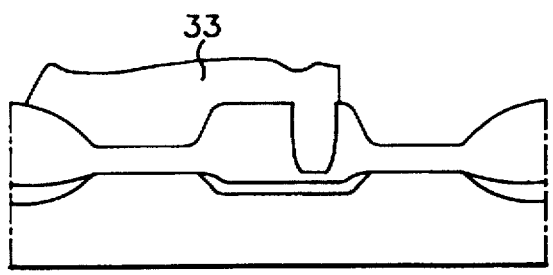
Figure 1H:
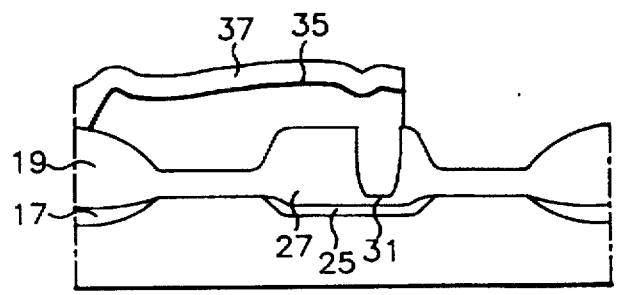
Figure 2:
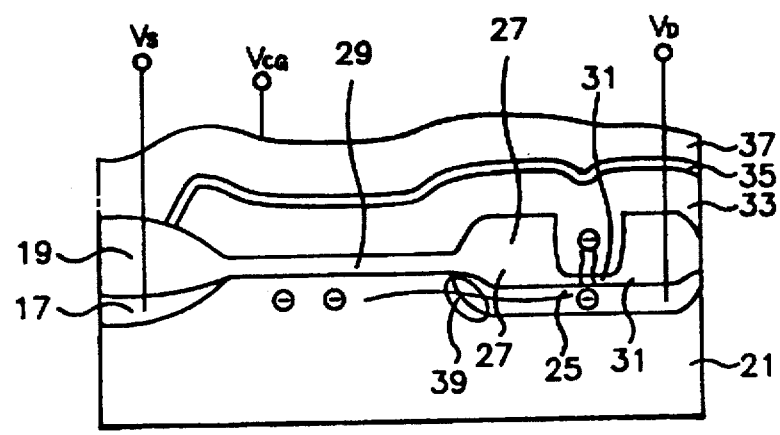
FIG. 2 illustrates an EEPROM cell formed by the process illustrated in FIGS. 1(a)–1(h)
Figure 3:
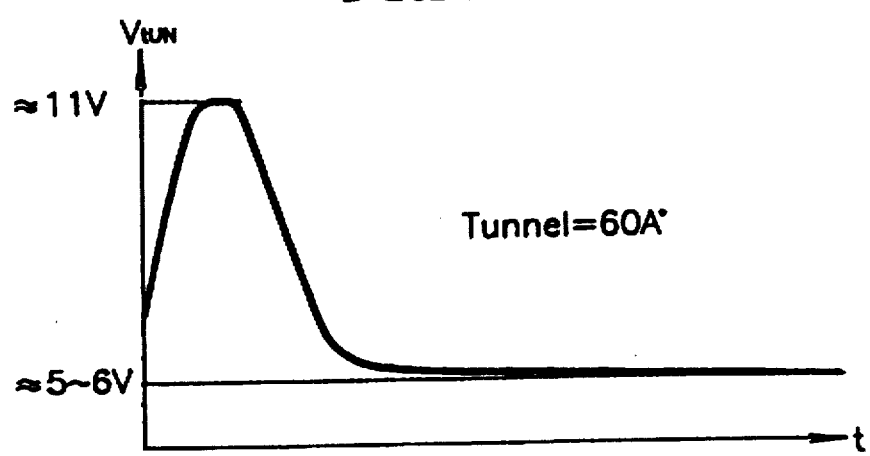
FIG. 3 illustrates the voltage across a tunnelling oxide film in the conventional EEPROM cell as a function of time during writing and erasing.
Figure 4:
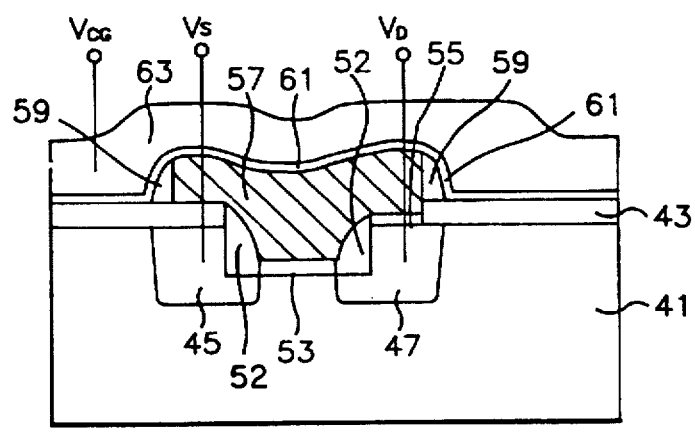
FIG. 4 illustrates a cross-sectional view of an EEPROM cell in accordance with the first embodiment of the present invention.

FIG. 4 is a cross-sectional view of an EEPROM cell in accordance with the first embodiment of the present invention. As shown in FIG. 4, the EEPROM cell includes a trench a having a specified depth overlying a channel region in a P-type substrate 41, and first spacers 52 are formed on both sidewalls inside the trench. A gate oxide film 53 is formed on a bottom surface of the trench between the first spacers 52, and buried N+-type source/drain regions 45 and 47, respectively, are provided on opposite sides of and extending outwardly away from the trench. In addition, the N+ source/drain regions 45 and 47 have a junction depth which is deeper than the depth of the trench. A thin tunnelling oxide film 55 is formed on the substrate 41 over drain region 47, and then oxide film 43 is formed as an insulation film over the entire surface of substrate 41, except portions of the substrate corresponding to the trench and tunnelling oxide film 55.

As further shown in FIG. 4, a floating gate 57 is provided on the substrate to overly source region 45, drain region 47 and tunnelling oxide film 55. Second spacers 59 are formed on oxide film 43 at opposed sidewalls of floating gate 57, and a dielectric film 61 is formed on a surface of floating gate 57 and on second spacers 59. Lastly, a control gate 63 is provided on dielectric film 63.

Data erasing, writing and reading in the EEPROM cell in accordance with the present invention will now be described.

First, when writing data into the EEPROM cell, a high voltage is applied to control gate 63 through a voltage application terminal $V_{CG}$. A low voltage is applied to drain region 47 through voltage application terminal $V_D$, while voltage application terminal $V_S$, which is coupled to source region 45, remains floating. Under these conditions, electrons in the channel region beneath the trench, are injected into drain region 47 due to a potential difference between control gate 63 and drain region 47. These electrons tunnel onto floating gate 57 through the thin tunnelling oxide film 55. Over the course of the writing step, electrons continue to accumulate on floating gate 57.

When data is erased from the EEPROM cell, a low voltage is applied to control gate 63 through voltage application terminal $V_{CG}$. Simultaneously, a high voltage is applied to drain region 47 via voltage application terminal $V_D$, while voltage application terminal $V_S$, coupled to source region 45, remains at a floating potential. When these voltages are applied to the EEPROM cell, a potential difference between control gate 63 and drain region 47 is created, causing electrons present on floating gate 57 to drain off through tunnelling oxide film 55 to drain region 47. Under these circumstances, even though a high voltage develops between drain region 47 and control gate 63, leakage current from drain region 47 to substrate 41 is significantly reduced. This is because the first spacers 52, constituting relatively thick oxide films, are provided between floating gate 57 and control gate 63. As a result, no depletion region is formed in drain region 47, as in the prior art EEPROM cell. Accordingly, leakage current flowing to the substrate is reduced.

When reading data from the EEPROM memory cell in accordance with the present invention, a static potential difference is preferably maintained between drain region 47 and source region 45. Accordingly, appropriate voltages are applied to the drain and source regions through voltage application terminals $V_D$ and $V_S$, respectively. Further, an appropriate voltage is applied to the control gate through voltage application terminal $V_{CG}$, such that the voltage difference between the drain region and the control gate is insufficient to cause electrons to tunnel from the drain region to floating gate 57 through tunnelling oxide film 55. Under these circumstances, data can be read by detecting a current flowing through the EEPROM cell.

Another advantage of the EEPROM cell in accordance with the present invention is that it has excellent cell topology or high planarization. Since the cell includes buried source/drain regions 45 and 47 with gate oxide film 53 formed in the trench between source and drain regions 45 and 47, the floating gate 57 can be deposited into the trench and over the source and drain regions, resulting in a relatively planar structure. The planarity of the structure is maintained after subsequent deposition of control gate 63.

A process for making the EEPROM cell in accordance with the present invention will now be discussed with reference to FIGS. 5(a)–5(j).

Figure 5A:
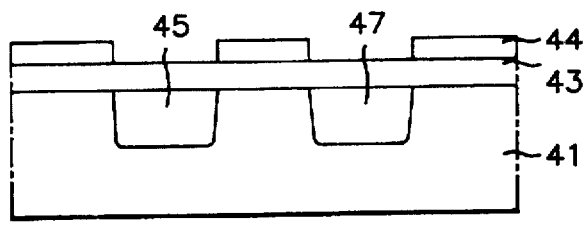
FIGS. 5(a)–5(j) illustrate process steps for fabricating an EEPROM cell in accordance with the present invention.

As shown in FIG. 5(a), an oxide film 43 is first formed as an insulation film on P-type semiconductor substrate 41. A photoresist film 44 is then coated on oxide film 43 and patterned to expose portions of substrate 41 where source and drain regions are to be subsequently formed. N-type impurities are then implanted into exposed portions of the substrate using patterned photoresist film 44 as a mask. As a result, heavily doped N-type source and drain regions 45 and 47, respectively, are formed with a predetermined junction depth and spaced by a predetermined distance. After the implantation of source and drain regions 45 and 47, patterned photoresist film 44 is removed.

Figure 5B:
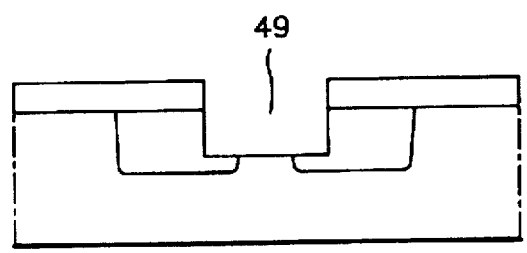

As shown in FIG. 5(b), a trench 49 is formed by etching oxide film 43 and semiconductor substrate 41 between source and drain regions 45 and 47. The trench is formed to have an etching depth that is less than the junction depths of the source and drain regions 45 and 47, and to include portions of the source and drain regions 45 and 47. A portion of semiconductor substrate 41 beneath trench region 49 will become a channel region.

Figure 5C:
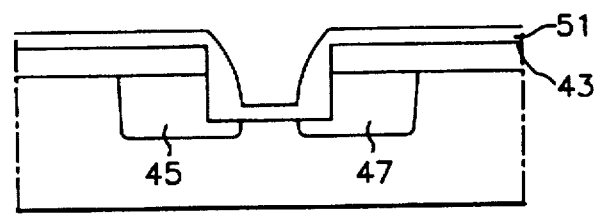
Figure 5D:
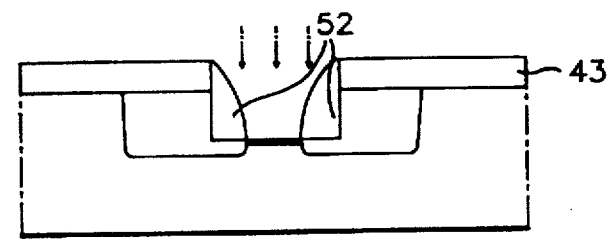

FIGS. 5(c) and 5(d) illustrate steps for forming first spacers 52. As shown in FIG. 5(c), an insulation film 51 is coated on the entire surface of substrate 41 including sidewalls of trench 49 in source and drain regions 45 and 47. As illustrated in FIG. 5(d), insulation film 51 is etched anisotropically, thereby leaving first spacers 52 formed on the sidewalls of trench 49, while leaving the channel region in substrate 41 exposed. As further shown in FIG. 5(d), impurity ions are implanted into the channel region of the substrate in order to adjust the threshold voltage of the EEPROM cell.

Figure 5E:
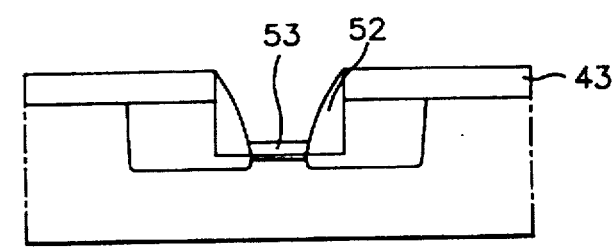
Figure 5F:
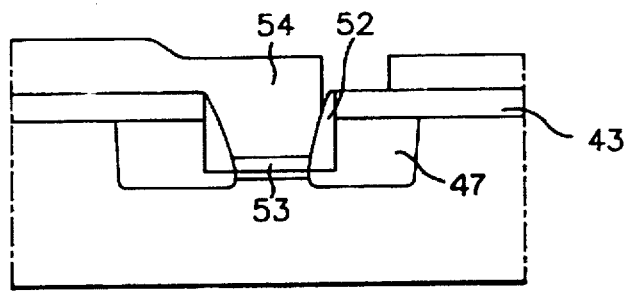

As shown in FIG. 5(e), a gate oxide film 53 is next formed on the exposed surface of substrate 41 at the bottom of trench 49. After forming gate oxide film 53, a photoresist film 54 is coated on the surface of the substrate and patterned to expose a portion of oxide film 43 overlying drain region 47 (see FIG. 5(f)). The exposed portion of oxide film 43 is removed, and remaining portions of photoresist film 54 are also removed. As a result, a portion of substrate 41 overlying drain region 47 is exposed.

Figure 5G:
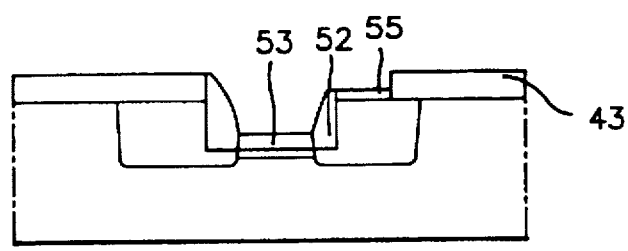
Figure 5H:
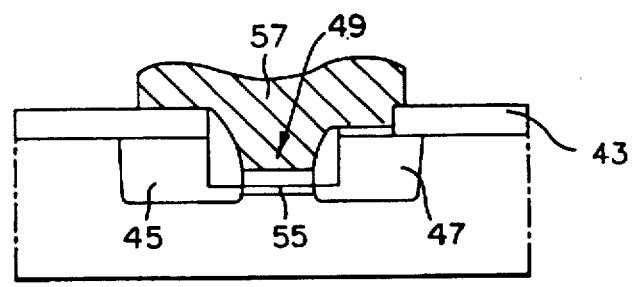

Next, as shown in FIG. 5(g), a thin tunnelling oxide film 55 is formed on the exposed substrate surface by performing an oxidation process. As illustrated in FIG. 5(h), a floating gate 57 is formed on portions of oxide film 43 overlying source and drain regions 45 and 47, as well as tunnelling oxide film 55 and trench 49.

Figure 5I:
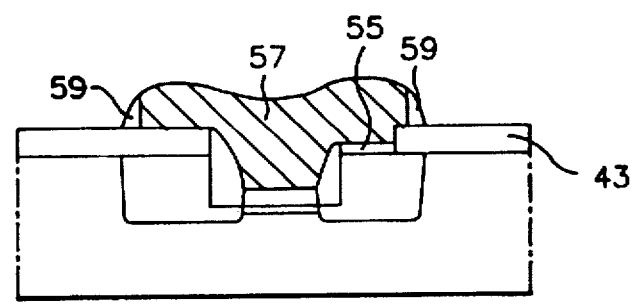

FIG. 5(i) illustrates a step in which second spacers 59 are formed on opposite sides of floating gate 57 overlying oxide film 43. Second spacers 59 are formed by coating an insulation film over the entire substrate surface and then anisotropically etching the oxide film to yield the structure shown in FIG. 5(i).

Figure 5J:
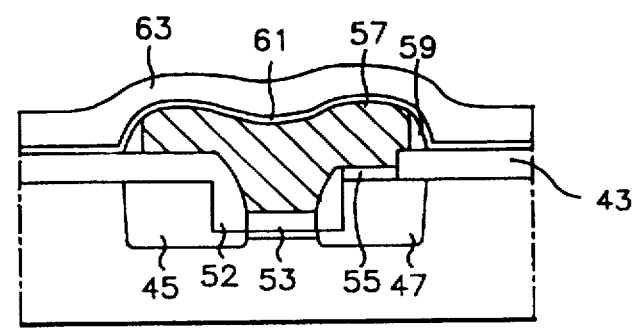

As shown in FIG. 5(j), a capacitor dielectric film 61 is formed on the surface of floating gate 57 and sidewall spacers 59. Lastly, a control gate electrode 63 is formed on insulative film 61, thereby completing the EEPROM cell in accordance with the present invention.

In accordance with the present invention, a large potential difference is developed across the trench and between the tunnelling oxide film 55 and the drain region 47 during an erasure step of the EEPROM cell. Accordingly, even though a high voltage exists between the drain and floating gate 57, leakage current flowing from the drain to substrate is prevented.

In addition, the EEPROM cell in accordance with the present invention has excellent cell topology because the source 45 and drain 47 regions of the cell have a buried structure, with gate oxide film 53 formed within a trench between the source and drain regions, and a floating gate 57 and control gate 63 formed above the trench. Further, the EEPROM cell in accordance with the present invention can be made without complicated field oxidation and field oxide etching steps. Thus, a process for making an EEPROM cell in accordance with the present invention is greatly simplified.

Although the invention has been described in conjunction with a specific embodiment, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A semiconductor device comprising:
    a substrate having a first conductivity type, said substrate having a primary surface;
    a channel region formed in said substrate;
    a trench formed in said primary surface of said substrate overlying said channel region, said trench having first and second sidewalls;
    a first spacer formed on said first sidewall and a second spacer formed on said second sidewall of said trench;
    a gate oxide film formed on a bottom portion of said trench between said first and second spacers;
    a source region having a second conductivity type formed in said substrate adjacent said first sidewall and said bottom of said trench;

a drain region having said second conductivity type formed in said substrate adjacent said second sidewall and said bottom of said trench, a portion of said drain region extending in a direction away from said trench;

a tunneling oxide film formed on said primary surface of said substrate overlying said portion of said drain region extending away from said trench, an edge portion of said tunneling oxide film being adjacent said trench;

an insulation film provided on said entire substrate surface, said insulation film exposing said tunneling oxide film and said trench;

a floating gate formed on said insulation film overlying said source region, said floating gate also overlying said gate oxide film and said tunneling oxide film, said floating gate having first and second side surfaces;

a third spacer formed on said insulation film adjacent said first side surface;

a fourth spacer formed on said insulation film adjacent said second side surface;

a dielectric film formed on said floating gate and said third and fourth spacers; and a control gate formed on said dielectric film.

2. The semiconductor device according to claim 1, wherein said semiconductor device is an EEPROM cell.

3. The semiconductor device according to claim 1, wherein said insulation film includes an oxide film.

4. The semiconductor device according to claim 1, wherein said source and drain regions have a buried structure, and said source and drain regions extending deeper into said substrate than said trench.

5. An EEPROM cell comprising:

a substrate of a first conductivity type, having a surface;

a source region of a second conductivity type formed in said substrate;

a drain region of said second conductivity type formed in said substrate, said source and drain regions being spaced from one another in said substrate;

a channel region being provided between said source and drain regions in the surface of said substrate;

a trench formed in the channel region;

a tunneling oxide film formed on said surface of said substrate overlying a portion of said drain region extending away from said trench, an edge portion of said tunneling oxide film being adjacent said trench;

first and second spacers respectively provided on opposed sidewalls of said trench;

a gate insulation film having a thickness less than said first and second spacers provided on said channel region between said first and second spacers; and a gate region overlying said gate insulation film, said trench and at least a portion of said source region.

6. An EEPROM cell in accordance with claim 5, further comprising a tunneling oxide film provided between said drain and gate regions and adjacent said trench.

7. An EEPROM cell in accordance with claim 5, further comprising spacers provided on opposed side surfaces of said gate region in overlying relation with portions of said source and drain regions.

* * * * *